US010290766B2

(12) United States Patent
Kim

(10) Patent No.: US 10,290,766 B2
(45) Date of Patent: May 14, 2019

(54) LIGHT EMITTING DEVICE

(71) Applicant: LG INNOTEK CO., LTD., Seoul (KR)

(72) Inventor: Chong Cook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 24 days.

(21) Appl. No.: 15/575,265

(22) PCT Filed: May 19, 2016

(86) PCT No.: PCT/KR2016/005328
§ 371 (c)(1),
(2) Date: Nov. 17, 2017

(87) PCT Pub. No.: WO2016/186467
PCT Pub. Date: Nov. 24, 2016

(65) Prior Publication Data
US 2018/0145208 A1    May 24, 2018

(30) Foreign Application Priority Data

May 20, 2015  (KR) ........................ 10-2015-0070628

(51) Int. Cl.
*H01L 33/50*  (2010.01)
*H01L 33/00*  (2010.01)
*H01L 33/06*  (2010.01)

(52) U.S. Cl.
CPC .......... *H01L 33/0075* (2013.01); *H01L 33/06* (2013.01); *H01L 33/50* (2013.01); *H01L 33/502* (2013.01)

(58) Field of Classification Search
None
See application file for complete search history.

(56) References Cited

U.S. PATENT DOCUMENTS

2004/0056258 A1 *  3/2004  Tadatomo ............... H01L 33/08
                                                    257/79
2007/0114540 A1    5/2007  Lee et al.
(Continued)

FOREIGN PATENT DOCUMENTS

JP    2004-128443 A    4/2004
JP    2008-34887 A     2/2008
(Continued)

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

Disclosed in an embodiment is a light emitting device comprising: a first semiconductor layer; an active layer disposed on the first semiconductor layer and comprising a plurality of well layers and a plurality of barrier layers; and a second semiconductor layer disposed on the active layer. The active layer comprises at least one first well layer which emits light of a first wavelength range and at least one second well layer which emits light of a second wavelength range, wherein the light of the first wavelength range has a first peak in the 450 nm to 499 nm wavelength region, and the light of the second wavelength range has a second peak in the 500 nm to 550 nm wavelength region.

18 Claims, 8 Drawing Sheets

(56) References Cited

U.S. PATENT DOCUMENTS

| | | | |
|---|---|---|---|
| 2007/0228931 A1* | 10/2007 | Kim | C09K 11/7734 313/501 |
| 2009/0206325 A1* | 8/2009 | Biwa | H01L 33/0025 257/28 |
| 2012/0153256 A1 | 6/2012 | Won | |

FOREIGN PATENT DOCUMENTS

| | | |
|---|---|---|
| JP | 2011-91434 A | 5/2011 |
| KR | 10-2009-0096911 A | 9/2009 |
| KR | 10-2013-0007919 A | 1/2013 |

* cited by examiner

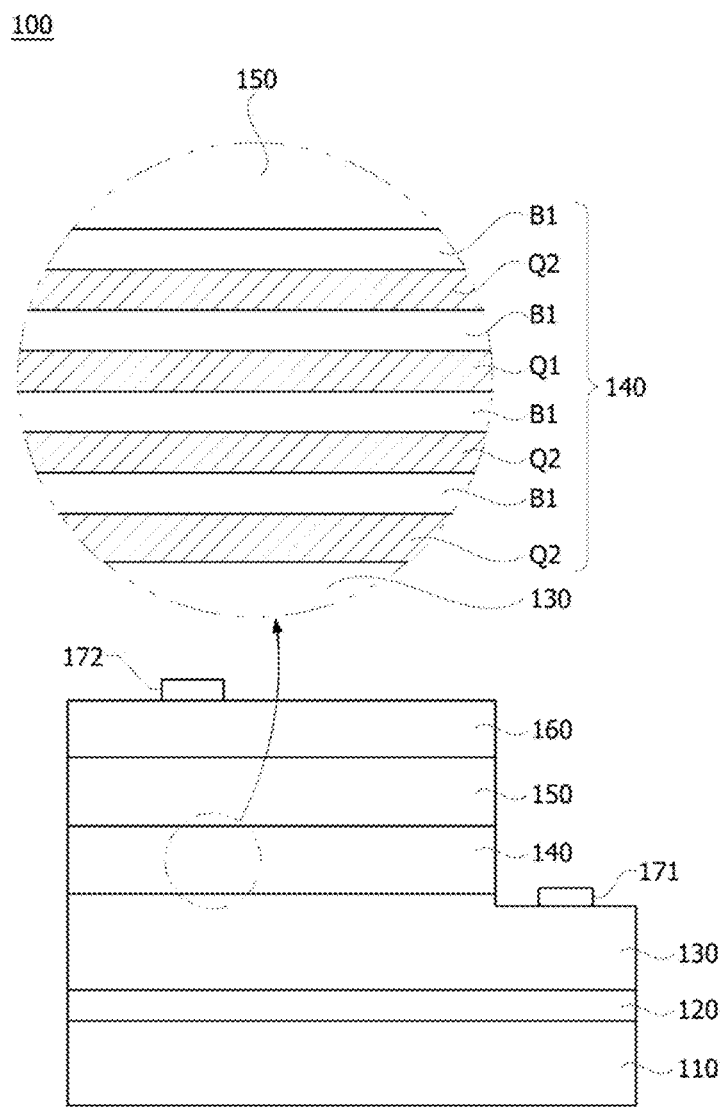
[FIG 1]

【FIG 2】
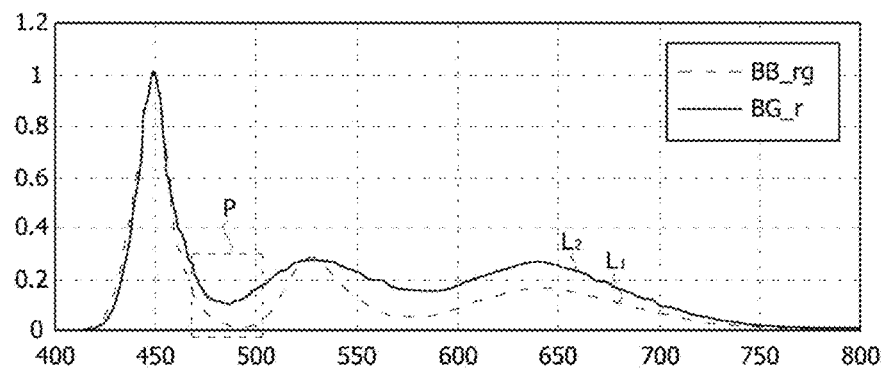
【FIG 3】
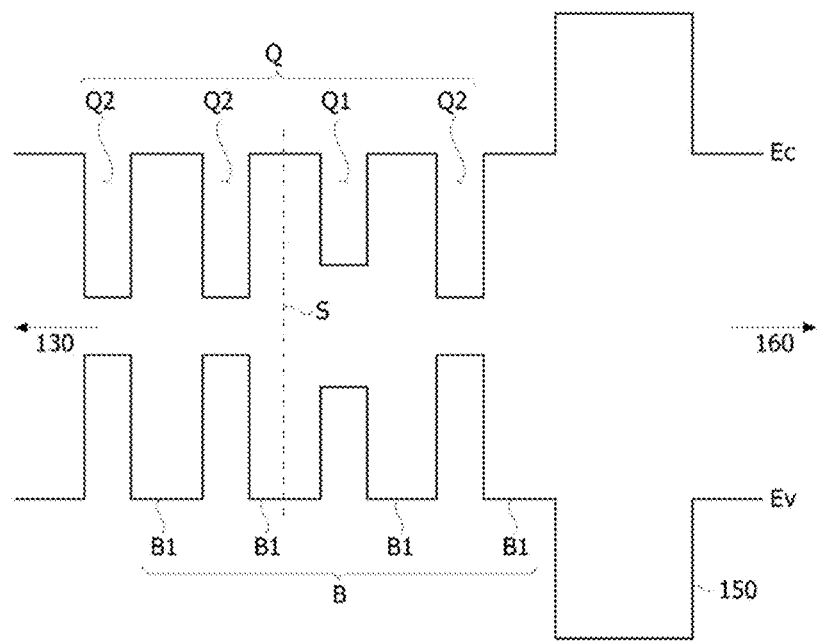

[FIG 4]
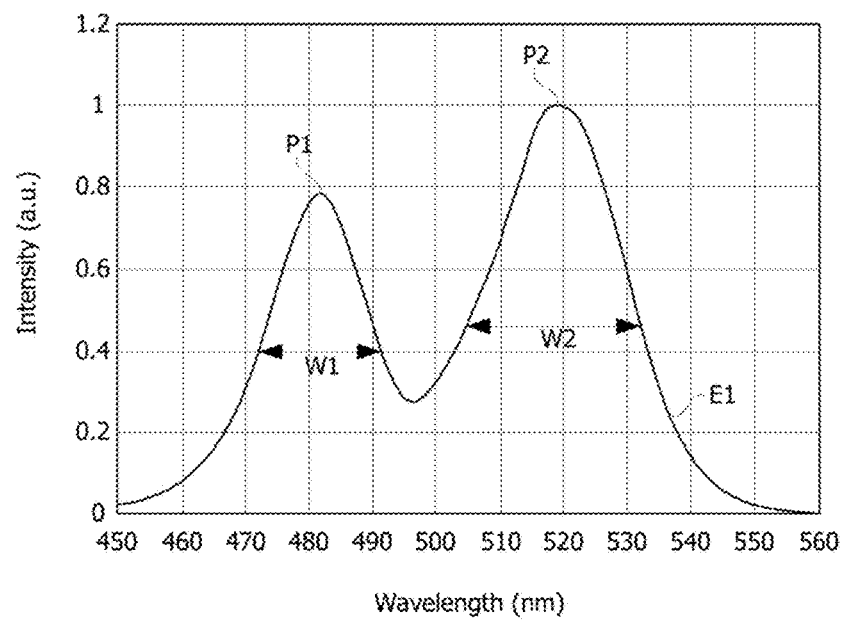
[FIG 5]
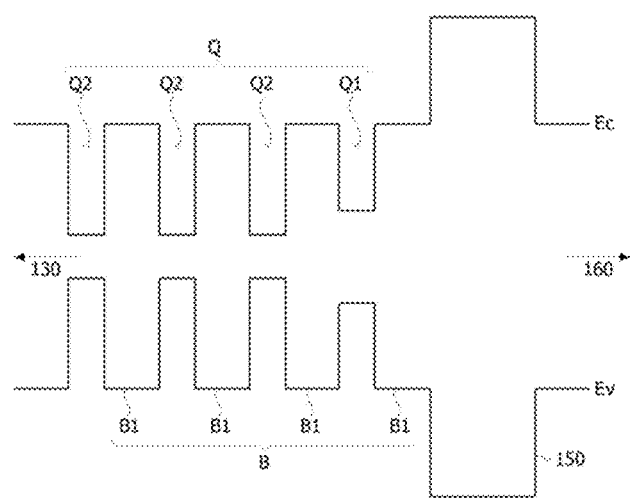

[FIG 6]
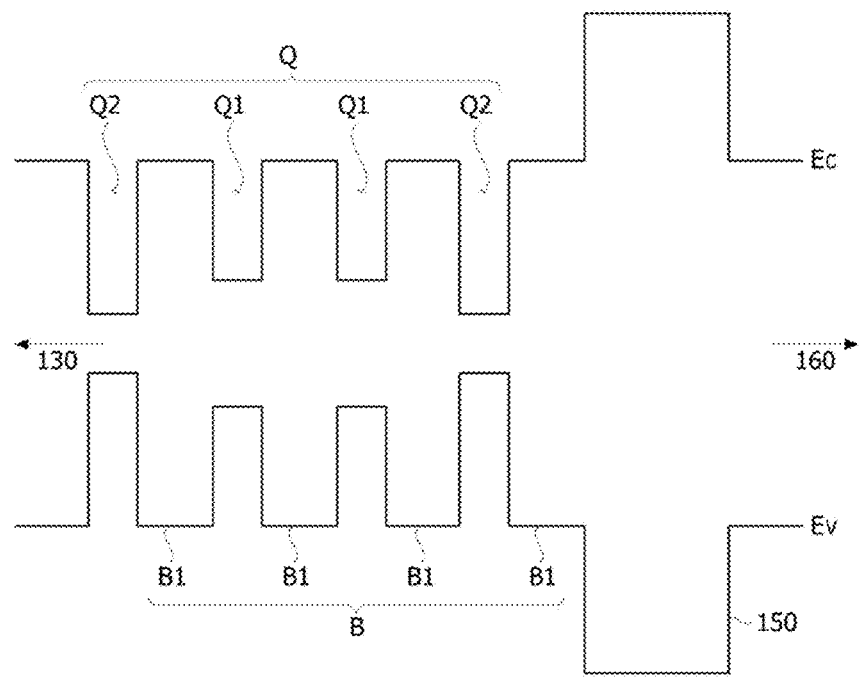
[FIG 7]
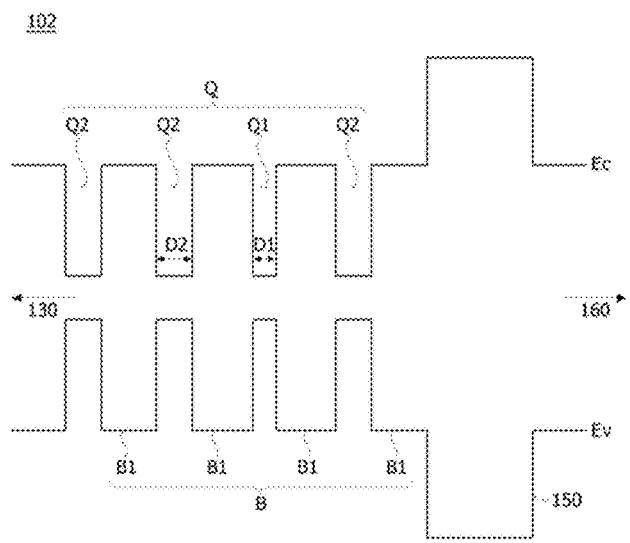

[FIG 8]
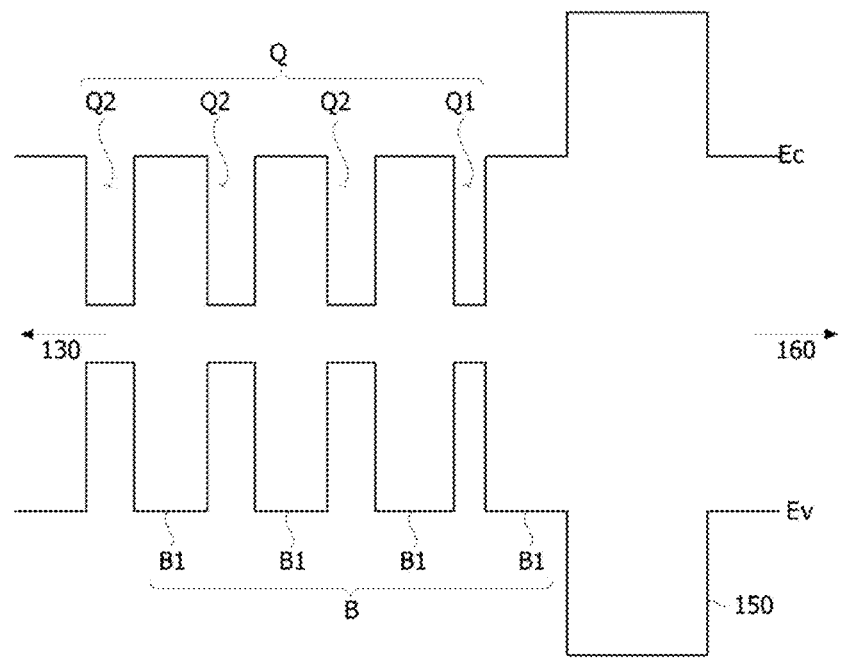
[FIG 9]
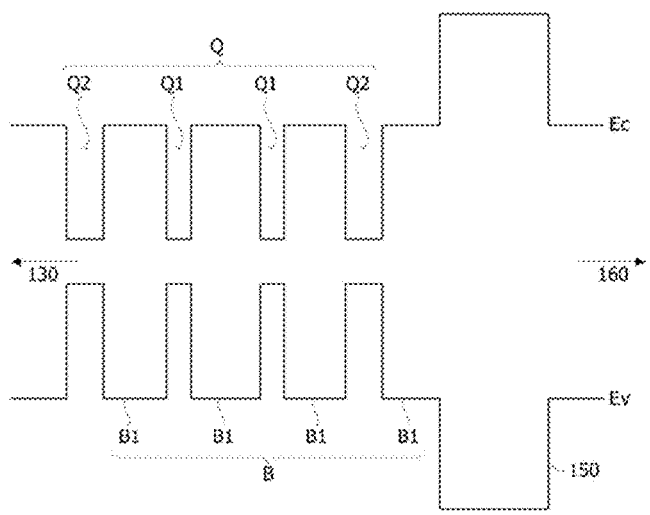

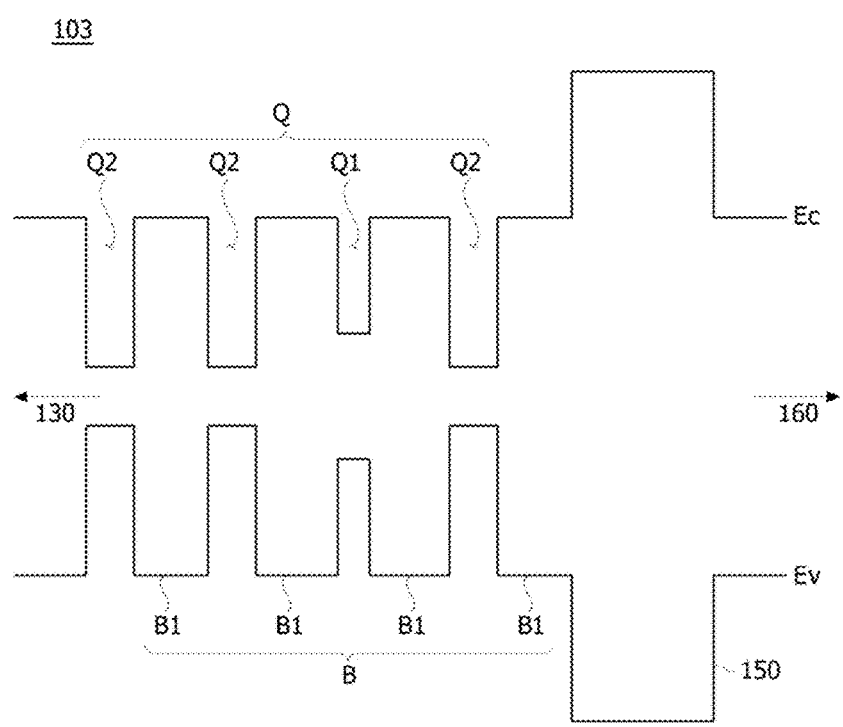
[FIG 10]

[FIG 11]
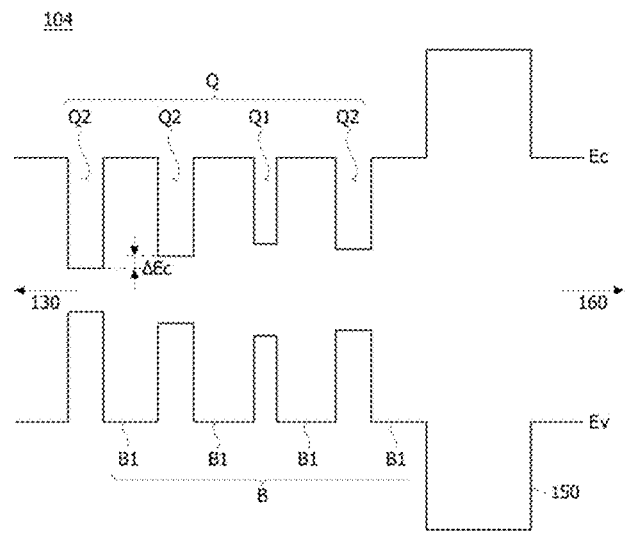
[FIG 12]
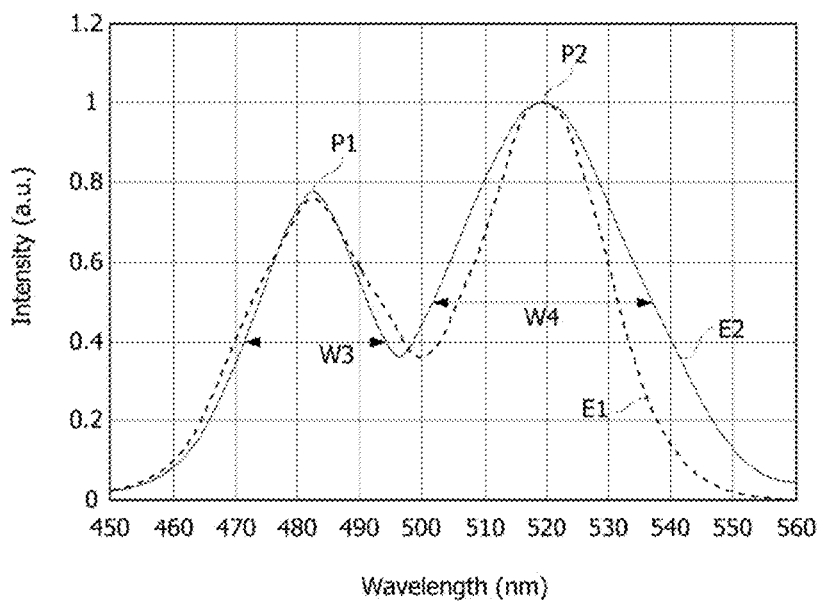

[FIG 13]
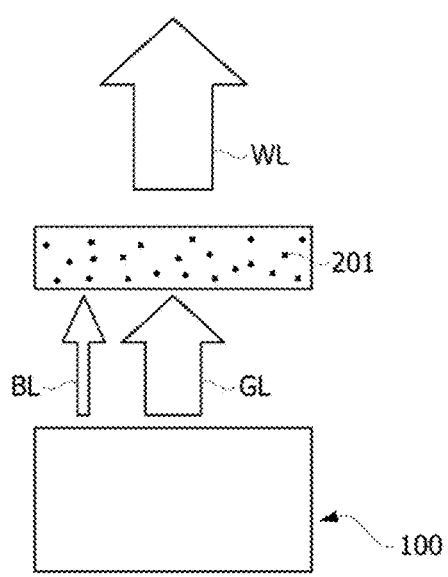

LIGHT EMITTING DEVICE

CROSS REFERENCE TO RELATED APPLICATIONS

This application is the National Phase of PCT International Application No. PCT/KR2016/005328, filed on May 19, 2016, which claims priority under 35 U.S.C. 119(a) to Patent Application No. 10-2015-0070628, filed in the Republic of Korea on May 20, 2015, all of which are hereby expressly incorporated by reference into the present application.

TECHNICAL FIELD

The present disclosure relates to a light emitting device.

BACKGROUND ART

A light emitting diode (LED) is a compound semiconductor device that converts electric energy into light energy, and various colors can be realized by controlling a composition ratio of the compound semiconductor.

Nitride semiconductor LEDs have advantages of low power consumption, a semi-permanent lifetime, a fast response time, safety, and environment friendliness when compared to conventional light sources such as fluorescent lamps and incandescent lamps. Accordingly, application of the nitride semiconductor LED has expanded to being applied as an LED backlight replacing a cold cathode fluorescent lamp (CCFL) that configures a backlight of a liquid crystal display (LCD) device, a white LED lighting device capable of replacing a fluorescent lamp or an incandescent lamp, a headlight of a vehicle, and traffic lights.

However, white light from an LED has a problem in that a color rendering index (CRI) thereof is insufficient. To resolve such a problem, a fluorescent substance excited at various wavelengths should be used.

DISCLOSURE

Technical Problem

Embodiments of the present disclosure provide a light emitting device capable of improving color rendering.

Also, embodiments of the present disclosure provide a light emitting device capable of simultaneously emitting blue light and green light.

Technical Solution

One aspect of the present disclosure provides a light emitting device including a first semiconductor layer; an active layer disposed on the first semiconductor layer and including a plurality of well layers and a plurality of barrier layers; and a second semiconductor layer disposed on the active layer, wherein the active layer includes one or more first well layers configured to emit light in a first wavelength range and one or more second well layers configured to emit light in a second wavelength range, the light in the first wavelength range has a first peak in a wavelength region of 450 nm to 499 nm, and the light in the second wavelength range has a second peak in a wavelength region of 500 nm to 550 nm.

An intensity of the first peak may be in a range of 30% to 80% with respect to an intensity of the second peak of 100%.

The first well layer may be disposed adjacent to the second semiconductor layer on the basis of a half point in a thickness direction of the active layer.

An energy band gap of the first well layer may be greater than that of the second well layer.

An indium content of the first well layer may be less than that of the second well layer.

A difference in indium content between the first well layer and the second well layer may be 10% or more.

A thickness of the first well layer may be less than that of the second well layer.

A difference in thickness between the first well layer and the second well layer may be 10% or more.

A half width of the first peak may be narrower than that of the second peak.

The light in the first wavelength range may have the first peak in a wavelength region of 470 nm to 490 nm, and the light in the second wavelength range may have the second peak in a wavelength region of 510 nm to 530 nm.

A plurality of second well layers may be disposed in the light emitting device, and the plurality of second well layers may have different energy band gaps.

Advantageous Effects

In accordance with the embodiments of the present disclosure, color rendering of white light can be improved. Particularly, a color rendering index (CRI) R12 can be improved without providing a separate fluorescent substance.

Various beneficial advantages and effects of the present disclosure are not limited by the detailed description and should be easily understood through a description of a detailed embodiment of the present disclosure.

DESCRIPTION OF DRAWINGS

FIG. 1 is a diagram illustrating a light emitting device according to an embodiment of the present disclosure.

FIG. 2 is a graph for describing color rendering of white light.

FIG. 3 is a diagram illustrating an energy band diagram of a light emitting device according to a first embodiment of the present disclosure.

FIG. 4 is a graph illustrating an optical characteristic of the light emitting device according to the first embodiment of the present disclosure.

FIGS. 5 and 6 show modified embodiments of the first embodiment.

FIG. 7 is a diagram illustrating an energy band diagram of a light emitting device according to a second embodiment of the present disclosure.

FIGS. 8 and 9 show modified embodiments of the second embodiment.

FIG. 10 is a diagram illustrating an energy band diagram of a light emitting device according to a third embodiment of the present disclosure.

FIG. 11 is a diagram illustrating an energy band diagram of a light emitting device according to a fourth embodiment of the present disclosure.

FIG. 12 is a graph illustrating an optical characteristic of the light emitting device according to the fourth embodiment of the present disclosure.

FIG. 13 is a diagram for describing a process of realizing white light using the light emitting device according to the embodiments of the present disclosure.

MODES OF THE INVENTION

The present disclosure may be variously modified and may have a variety of embodiments, however, specific embodiments thereof will be illustrated in the drawings and descriptions thereof will be given. The embodiments, however, are not to be taken in the sense of limiting the present disclosure to the specific embodiments and should be construed as including modifications, equivalents, or substitutions within the spirit and technical scope of the present disclosure.

Further, terms including ordinal numbers such as "first," "second," and the like used herein are used to describe various components, but the components are not limited by the terms. The terms are used only for the purpose of distinguishing one component from another component. For example, without departing from the scope of the present disclosure, a first component may be referred to as a second component, and similarly, a second component may also be referred to as a first component. The term "and/or" includes a combination of a plurality of related listed items and any one item of the plurality of related listed items.

The terms used herein are employed to describe only specific embodiments and are not intended to limit the present disclosure. Unless the context clearly dictates otherwise, the singular form includes the plural form. It should be understood that the terms "comprise" and "have" specify the presence of stated herein features, numbers, steps, operations, elements, components, and combinations thereof, but do not preclude the presence or possibility of addition of one or more other features, numbers, steps, operations, elements, components, and combinations thereof.

In the description of the embodiments, when an element is described as being formed "on" or "under," another element, the terms "on" or "under" includes the meaning of the two components being in direct contact with each other and the meaning of the two components being indirectly disposed by one or more other components being formed therebetween. Further, when an element is described as being formed "on" or "under" another element, the description may include the meaning of the other element being "formed in an upward direction of the element" and "formed in a downward direction of the element."

Hereinafter, embodiments of the present disclosure will be described in detail with reference to the accompanying drawings, the same reference numerals will be assigned to the same or corresponding components regardless of reference numerals, and repetitive descriptions thereof will be omitted.

FIG. 1 is a diagram illustrating a light emitting device according to an embodiment of the present disclosure.

Referring to FIG. 1, a light emitting device 100 according to the embodiment of the present disclosure includes a first semiconductor layer 130 disposed on a support substrate 110, an active layer 140 disposed on the first semiconductor layer 130 and including well layers Q1 and Q2 and barrier layers B1, and a second semiconductor layer 160 formed on the active layer 140.

The support substrate 110 includes a conductive substrate or an insulating substrate. The support substrate 110 may be a material suitable for semiconductor material growth or may be a carrier wafer. The support substrate 110 may be formed of a material selected from among sapphire ($Al_2O_3$), SiC, GaAs, GaN, ZnO, Si, GaP, InP, and Ge, but is not limited thereto.

A buffer layer 120 may be further provided between the first semiconductor layer 130 and the support substrate 110.

The buffer layer 120 may alleviate lattice non-conformity between the support substrate 110 and a light emitting structure provided thereon.

The buffer layer 120 may include a combination of Group III and Group V elements, or may include any one of GaN, InN, AlN, InGaN, AlGaN, InAlGaN, and AlInN. The buffer layer 120 may be doped with a dopant, but is not limited thereto.

The buffer layer 120 may be grown as a single crystal on the support substrate 110, and the buffer layer 120 grown as the single crystal may improve crystallizability of the first semiconductor layer 130, which is grown on the buffer layer 120.

A light emitting structure provided on the support substrate 110 includes the first semiconductor layer 130, the active layer 140, and the second semiconductor layer 160. Generally, the above-described light emitting structure may be divided into a plurality of structures by cutting the support substrate 110.

The first semiconductor layer 130 may be formed of a Group III-V or II-VI compound semiconductor, and the first semiconductor layer 130 may be doped with a first dopant. For example, the first semiconductor layer 130 may be selected from among GaN, AlGaN, InGaN, InAlGaN, and the like which are semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$). Further, the first dopant may be an n-type dopant such as Si, Ge, Sn, Se, or Te. When the first dopant is the n-type dopant, the first semiconductor layer 130 doped with the first dopant may be an n-type semiconductor layer.

The active layer 140 is a layer in which electrons (or holes) implanted through the first semiconductor layer 130 and holes (or electrons) implanted through the second semiconductor layer 160 are recombined. The active layer 140 may transition to being a low energy level due to the recombination of electrons and holes and emit light having a wavelength corresponding to the transition.

The active layer 140 may have any one of a single well structure, a multi-well structure, a single quantum well structure, a multi quantum well (MQW) structure, a quantum dot structure, and a quantum wire structure, but the active layer 140 is not limited thereto.

The second semiconductor layer 160 may be formed on the active layer 140, may be implemented with a Group III-V or II-VI compound semiconductor, and may be doped with a second dopant. The second semiconductor layer 160 may be formed of a semiconductor material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$) or a material selected from among AlInN, AlGaAs, GaP, GaAs, GaAsP, and AlGaInP. When the second dopant is a p-type dopant such as Mg, Zn, Ca, Sr, Ba, or the like, the second semiconductor layer 160 doped with the second dopant may be a p-type semiconductor layer.

An electron blocking layer (EBL) 150 may be disposed between the active layer 140 and the second semiconductor layer 160. The EBL 150 may block a flow of electrons which are supplied from the first semiconductor layer 130 and are discharged to the second semiconductor layer 160, thereby increasing the probability of the electrons recombining with holes in the active layer 140. An energy band gap of the EBL 150 may be greater than that of the active layer 140 and/or the second semiconductor layer 160.

For example, the EBL 150 may be selected from among AlGaN, InGaN, InAlGaN, and the like which are semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$).

A first electrode 171 may be formed on the first semiconductor layer 130 that is partially exposed. Further, a second electrode 172 may be formed on the second semiconductor layer 160.

The first electrode 171 and the second electrode 172 may include a conductive material, e.g., a metal selected from among In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or an alloy thereof, and may be formed as a single layer or a multilayer, but the first electrode 171 and the second electrode 172 are not limited thereto.

FIG. 2 is a graph for describing color rendering of white light.

Referring to FIG. 2, it can be seen that a white light emitting diode (LED) package including two blue LEDs, a green fluorescent substance, and a red fluorescent substance has a light spectrum L1 which has a low intensity in a wavelength region P in a range of 470 nm and 520 nm. On the other hand, it can be seen that a light spectrum L2 of a white LED package including a blue LED, a green LED, and a red fluorescent substance has a relatively higher intensity in the wavelength region P in the range of 470 nm and 520 nm. Therefore, it can be seen that, when white light is realized by exciting the red fluorescent substance with blue light and green light emitted from the blue and green LEDs, wavelength intensity in the range of 470 nm and 520 nm can be relatively improved.

A color rendering index (CRI) is an index that evaluates how well light in a light source makes an inherent color of an object appear as a natural color. The CRI is classified into an average CRI Ra for calculating an average value of eight colors defined as R1 to R8, and special CRIs R9 to R15.

The special CRIs include red R9, yellow R10, blue R12, and the like. Generally, the CRIs of red R9 and blue R12 tend to deteriorate. In FIG. 2, the wavelength region P in the range of 470 nm and 520 nm corresponds to the CRI R12. Accordingly, when the wavelength intensity in the range of 470 nm to 520 nm is increased, the CRI R12 can be improved.

FIG. 3 is a diagram illustrating an energy band diagram of a light emitting device according to a first embodiment of the present disclosure, FIG. 4 is a graph illustrating an optical characteristic of the light emitting device according to the first embodiment of the present disclosure, and FIGS. 5 and 6 show modified embodiments of the first embodiment.

Referring to FIG. 3, in a light emitting device 101 according to the first embodiment of the present disclosure, the active layer 140 may have a structure in which a well layer Q and a barrier layer B are alternately disposed. The well layer Q may include one or more first well layers Q1 configured to emit light in a first wavelength range, and one or more second well layers Q2 configured to emit light in a second wavelength range.

The first well layer Q1 may emit light having a peak in a 450 nm to 499 nm wavelength region. In addition, the second well layer Q2 may emit light having a peak in a 500 nm to 550 nm wavelength region. Hereinafter, the light emitted from the first well layer Q1 is defined as blue light, and the light emitted from the second well layer Q2 is defined as green light.

The active layer 140 of the present embodiment may simultaneously emit the blue light and the green light. The green light may be main light emitted from the light emitting device, and the blue light may be sub-light for improving the CRI R12.

The blue light may have a first peak in the 450 nm to 499 nm wavelength region or in a 470 nm to 490 nm wavelength region. The green light may have a second peak in the 500 nm to 550 nm wavelength region or in a 510 nm to 530 nm wavelength region. An interval between the first peak and the second peak may be in a range of about 30 nm to 50 nm.

The first well layer Q1 may be disposed adjacent to the EBL 150 and the second semiconductor layer 160 on the basis of a half point S in a thickness direction of the active layer 140. Since a hole, which is a carrier, has lower mobility than an electron due to an effective mass thereof, many holes are implanted into a well layer adjacent to the EBL 150, resulting in high light emitting efficiency. Accordingly, the first well layer Q1 may be disposed adjacent to the EBL 150 and the second semiconductor layer 160 to have effective light emitting intensity with a few first well layers Q1.

Each of the first well layer Q1 and the second well layer Q2 may have a composition formula of $In_xAl_yGa_{1-x-y}N$ ($0 \leq x \leq 1$, $0 \leq y \leq 1$, $0 \leq x+y \leq 1$). As an indium (In) content increases, an energy bandgap of the well layer Q may decrease, whereas, as the indium (In) content decreases, the energy bandgap thereof may increase. Consequently, the indium content of the first well layer Q1 may be less than that of the second well layer Q2. That is, the energy band gap of the first well layer Q1 may be greater than that of the second well layer Q2.

The first well layer Q1 may have an indium content in a range of 14% to 24% to emit blue light. The second well layer Q2 may have an indium content in a range of 20% to 30% to emit green light. Each of the first well layer Q1 and the second well layer Q2 may have a thickness in a range of 2.2 nm to 2.7 nm.

To control a light emission wavelength, a difference in indium content between the first well layer Q1 and the second well layer Q2 may be adjusted to 5% or more. As one example, when the indium content of the second well layer Q2 is 25%, the indium content of the first well layer Q1 may be 20%.

In FIG. 3, the first well layer Q1 is shown as being disposed at a third position toward the second semiconductor layer 160 from the first semiconductor layer 130, but the present disclosure is not limited thereto. The first well layer Q1 may be one or more of a plurality of well layers disposed in the active layer.

Referring to FIG. 4, an intensity of a first peak P1 of the blue light may be in a range of 30% to 80% with respect to an intensity of a second peak P2 of the green light of 100% on an optical spectrum E1. When the intensity of the first peak P1 is in the range of 30% to 80%, the CRI R12 can be effectively improved to realize white light with high color rendering. When the intensity of the first peak P1 exceeds 80%, the light emitting intensity of the green light may be relatively weakened.

A half width W1 of the blue light may be formed to be smaller than a half width W2 of the green light. The blue light may be made to have high optical output intensity according to a wavelength of R12. When the half width W1 of the blue light is widened, the intensity thereof is relatively decreased such that an improvement effect of the CRI R12 may be reduced. On the other hand, for white light with high color rendering, the half width W2 of the green light may be widely formed. Accordingly, the half width W2 of the green light may be wider than the half width W1 of the blue light.

Referring to FIG. 5, the first well layer Q1 may be disposed closest to the EBL 150. In this case, since hole implantation efficiency is high, a large light emitting intensity may be obtained, and thus it may be advantageous to improve the CRI R12.

Referring to FIG. 6, a plurality of first well layers Q1 may be disposed. This structure has an advantage in that the number of first well layers Q1 may be appropriately adjusted to maintain the intensity of the blue light in the range of 30% to 80% with respect to that of the green light.

FIG. 7 is a diagram illustrating an energy band diagram of a light emitting device according to a second embodiment of the present disclosure, and FIGS. 8 and 9 show modified embodiments of the second embodiment.

Referring to FIG. 7, in a light emitting device 102 according to the second embodiment, a band gap of each of the first well layer Q1 and the second well layer Q2 may be adjusted by controlling a thickness of the well layers. An energy level of light generated in the well layer satisfies the following Equation 1.

$$E_n = \frac{n^2 h^2 \pi^2}{2\,mL} \quad \text{[Equation 1]}$$

At this point, L corresponds to the thickness of the well layer. As the thickness of the well layer increases, the energy level of light generated in the well layer decreases. Accordingly, the energy level of the first well layer Q1 may be increased by controlling a thickness D1 of the first well layer Q1 to be smaller than a thickness D2 of the second well layer Q2. As a result, the first well layer Q1 may emit blue light.

The first well layer Q1 may have a thickness in a range of 1.5 nm to 3.4 nm to emit the blue light. The second well layer Q2 may have a thickness in a range of 2.0 nm to 3.5 nm to emit the green light. At this point, to control a light emission wavelength, a difference in thickness between the first well layer Q1 and the second well layer Q2 may be adjusted to be 10% or more. As one example, when the thickness of the second well layer Q2 is 2.5 nm, the thickness of the first well layer Q1 may be 2.0 nm.

In FIG. 7, the first well layer Q1 is shown as being disposed at a third position toward the second semiconductor layer 160 from the first semiconductor layer 130, but the present disclosure is not limited thereto. The first well layer Q1 may be one or more of a plurality of well layers.

Referring to FIG. 8, the first well layer Q1 may be disposed closest to the EBL 150. In this case, the largest light emitting intensity may be obtained, and thus it may be advantageous for improving the CRI R12. Referring to FIG. 9, a plurality of first well layers Q1 may be disposed. This structure has an advantage in that the number of the first well layers Q1 may be adjusted to maintain the intensity of the blue light in the range of 30% to 80% with respect to that of the green light.

FIG. 10 is a diagram illustrating an energy band diagram of a light emitting device according to a third embodiment of the present disclosure.

Referring to FIG. 10, in a light emitting device 103 according to the third embodiment, a content and a thickness of indium may be simultaneously controlled to adjust an energy band gap of the first well layer Q1. A difference in peak wavelength between blue light emitted from the first well layer Q1 and green light emitted from the second well layer Q2 may be in a range of 30 nm to 50 nm, or in a range of 38 nm to 45 nm.

At this point, a configuration in which only the indium content or only the thickness of the well layer is adjusted to shift a light emission wavelength by about 40 nm may not be effective. As one example, when the thickness of the well layer is reduced to less than 2.3 nm, an effect of confining a carrier in the well layer may be reduced. In addition, when the indium content is decreased to be less than 23%, a difference in strain between adjacent well layers may become large and strain may be concentrated at a well layer having a relatively high indium content such that efficiency may be decreased.

Consequently, in the present embodiment, the thickness is reduced to about 2.3 nm with respect to a second well layer (in which a thickness is 3 mm and an indium content is 27%), which is configured to emit green light, to shift a wavelength of about 20 nm toward a short wavelength and decrease the indium content to be about 23% such that the wavelength of about 20 nm may be shifted to the short wavelength. A thickness of the first well layer Q1 may be in a range of 2.2 nm to 2.4 nm, and an indium content thereof may be in a range of 22% to 24%. That is, the thickness of the first well layer Q1 may be in a range of 70% to 80% with respect to a thickness of the second well layer Q2 of 100%, and the indium content of the first well layer Q1 may be in a range of 80% to 90% with respect to an indium content of the second well layer Q2 of 100%. When this condition is satisfied, a carrier confinement effect may be maintained while suppressing a strain difference between the adjacent well layers.

FIG. 11 is a diagram illustrating an energy band diagram of a light emitting device according to a fourth embodiment of the present disclosure, and FIG. 12 is a graph illustrating an optical characteristic of the light emitting device according to the fourth embodiment of the present disclosure.

Referring to FIG. 11, in a light emitting device 104 according to the fourth embodiment, energy band gaps of the second well layers Q2 may be formed to be different. In FIG. 11, an energy bandgap ΔEc is shown as being increased from the first semiconductor layer 130 toward the second semiconductor layer 160, but the present disclosure is not limited thereto.

The second well layer Q2 is a main well layer configured to emit green light, and may be advantageous for enhancing color rendering as a half width of the second well layer Q2 is increased. When energy band gaps of the plurality of second well layers Q2 are formed to be different, a peak of light emitted from each of the plurality of second well layers Q2 may be different. Since the light emitted from each of the plurality of second well layers Q2 has a peak in a wavelength range of green light, the light may be mixed to generate green light having a wide wavelength range.

The peak of the light emitted from each of the plurality of second well layers Q2 is in a range of 500 nm to 550 nm, and a difference between the peaks may be within 20 nm. At this point, an energy level may be controlled by adjusting an indium content and/or a thickness of the well layer.

Referring to FIG. 12, it can be seen that a half width W4 of the green light on a second light spectrum E2 is increased in comparison to a half width of the green light on a first light spectrum E1. The second light spectrum E2 is a spectrum when the energy band gaps of the second well layers Q2 are adjusted to be different, while the first light spectrum E1 is a spectrum when the energy band gaps of the second well layers Q2 are formed to be the same. Consequently, a wavelength region of the green light is widened such that white light with high color rendering can be realized.

In addition, as the half width W4 of the green light is widened, a half width W3 of blue light may be relatively narrowed. As a result, an intensity of the blue light is increased, and thus an improvement effect of the CRI R12 may be enhanced.

The half width W4 of the green light may be in a range of 25 nm to 35 nm. This is because a light emission wavelength of each of the plurality of second well layers is changed. The half width W3 of the blue light may be in a range of 20 nm to 27 nm. This is because the indium content of the first well layer is decreased while the thickness thereof is reduced. As a result, the half width is decreased and an optical output is increased, and thus the CRI R12 can be effectively improved.

FIG. 13 is a diagram for describing a process of realizing white light using the light emitting device according to the embodiments of the present disclosure.

Referring to FIG. 13, the light emitting device 100 may emit light in which blue light BL emitted from the first well layer and green light GL emitted from the second well layer are mixed. A red fluorescent substance 201 may convert a portion of the mixed light into red light to realize white light WL. In the red fluorescent substance, wavelength conversion efficiency of the green light is relatively superior to that of the blue light. Consequently, when a light emitting device in which the green light is main light is used, light with high color rendering can be realized. The red fluorescent substance 201 may further have a condition of improving the CRI R9. The red fluorescent substance 201 may include any one of YAG-based, TAG-based, silicate-based, sulfide-based, and nitride-based fluorescent materials, but embodiments are not specifically limited to a certain kind of fluorescent material. The red fluorescent substance 201 may be a KSF fluorescent substance ($K_2SiF_6:Mn^{4+}$).

According to the embodiment, the CRI R12 can be improved by the blue light BL emitted from the light emitting device 100. Consequently, color rendering of the white light WL can be improved.

The light emitting device of the embodiment of the present disclosure may be configured to further include optical members such as a light guide plate, a prism sheet, a diffuser sheet, and the like, and may serve as a backlight unit. Further, the light emitting device of the embodiment of the present disclosure may be further applied to a display device, a lighting device, and a pointing device.

At this point, the display device may include a bottom cover, a reflector, a light emitting module, a light guide plate, an optical sheet, a display panel, an image signal output circuit, and a color filter. The bottom cover, the reflector, the light emitting module, the light guide plate, and the optical sheet may configure a backlight unit.

The reflector is disposed on the bottom cover, and the light emitting module emits light. The light guide plate is disposed in front of the reflector to guide the light emitted from the light emitting module toward a front side, and the optical sheet includes a prism sheet and the like and is disposed in front of the light guide plate. The display panel is disposed in front of the optical sheet, the image signal output circuit supplies an image signal to the display panel, and the color filter is disposed in front of the display panel.

Additionally, the lighting apparatus may include a light source module including a substrate and the light emitting device according to the embodiment of the present disclosure, a heat dissipation unit configured to dissipate heat of the light source module, and a power supplier configured to process or convert an electric signal provided from the outside and provide the electrical signal to the light source module. Further, the lighting device may include a lamp, a head lamp, a street lamp, or the like.

It should be understood that embodiments of the present disclosure are not limited to the above described embodiments and the accompanying drawings, and various substitutions, modifications, and alterations can be devised by those skilled in the art that without departing from the technical spirit of the embodiment described herein.

The invention claimed is:

1. A light emitting device comprising:
a first semiconductor layer;
an active layer disposed on the first semiconductor layer and including a plurality of well layers and a plurality of barrier layers; and
a second semiconductor layer disposed on the active layer,
wherein the plurality of well layers of the active layer includes one or more first well layers configured to emit a first light in a first wavelength range and one or more second well layers configured to emit a second light in a second wavelength range,
wherein the first light in the first wavelength range has a first peak in a wavelength region of 470 nm to 490 nm, and the second light in the second wavelength range has a second peak in a wavelength region of 510 nm to 530 nm,
wherein an intensity of the first peak is in a range of 30% to 80% with respect to an intensity of the second peak, and
wherein a half width of the first peak is narrower than a half width of the second peak.

2. The light emitting device of claim 1, wherein the first well layer is disposed adjacent to the second semiconductor layer on the basis of a half point in a thickness direction of the active layer.

3. The light emitting device of claim 1, wherein an energy band gap of the one or more first well layers is greater than that of the one or more second well layers.

4. The light emitting device of claim 1, wherein an indium content of the one or more first well layers is less than that of the one or more second well layers.

5. The light emitting device of claim 4, wherein a difference in indium content between the one or more first well layers and the one or more second well layers is 10% or more.

6. The light emitting device of claim 1, wherein a thickness of the one or more first well layers is less than that of the one or more second well layers.

7. The light emitting device of claim 1, wherein a difference in thickness between the one or more first well layers and the one or more second well layers is 10% or more.

8. The light emitting device of claim 1, wherein an interval between the first peak and the second peak is in a range of 30 nm to 50 nm.

9. The light emitting device of claim 8, wherein:
a thickness of the one or more first well layers is in a range of 70% to 80% with respect to a thickness of the one or more second well layers of 100%; and
an indium content of the one or more first well layers is in a range of 80% to 90% with respect to an indium content of the one or more second well layers of 100%.

10. The light emitting device of claim 8, wherein a thickness of the one or more first well layers is in a range of 2.2 nm to 2.4 nm, and an indium content thereof is in a range of 22% to 24%.

11. The light emitting device of claim 1, wherein:
the one or more second well layers includes a plurality of second well layers, each of which is identical to each other, are disposed; and
wherein the plurality of second well layers have different energy band gaps.

12. The light emitting device of claim 1, wherein the half width of the first peak is in a range of 20 nm to 27 nm and the half width of the of the second peak is in a range of 25 nm to 35 nm.

13. The light emitting device of claim 4, wherein a thickness of the one or more first well layers is less than that of the one or more second well layers.

14. A light emitting device package comprising:
a light emitting device; and
a wavelength conversion layer configured to convert a wavelength of a portion of light emitted from the light emitting device,
wherein the light emitting device includes:
a first semiconductor layer;
an active layer disposed on the first semiconductor layer and including a plurality of well layers and a plurality of barrier layers; and
a second semiconductor layer disposed on the active layer,
wherein the plurality of well layers of the active layer includes one or more first well layers configured to emit a first light in a first wavelength range and one or more second well layers configured to emit a second light in a second wavelength range,
wherein the first light in the first wavelength range has a first peak in a wavelength region of 470 nm to 490 nm, and the second light in the second wavelength range has a second peak in a wavelength region of 510 nm to 530 nm,
wherein an intensity of the first peak is in a range of 30% to 80% with respect to an intensity of the second peak, and
wherein a half width of the first peak is narrower than a half width of the of the second peak.

15. The light emitting device of claim 14, wherein light, in which the first light in the first wavelength range and the second light in the second wavelength range, which are emitted from the light emitting device, and the light having the wavelength converted by the wavelength conversion layer are mixed, is white light.

16. The light emitting device of claim 14, wherein an interval between the first peak and the second peak is in a range of 30 nm to 50 nm.

17. A lighting device comprising the light emitting device package according to claim 14.

18. The light emitting device of claim 14, wherein the wavelength conversion layer comprises a phosphor comprising $K_2SiF_6:Mn^{4+}$.

* * * * *